United States Patent
Fleizach et al.

(10) Patent No.: US 9,130,595 B1
(45) Date of Patent: Sep. 8, 2015

(54) SYSTEM AND METHOD FOR ACCELERATION EFFECT CORRECTION USING TURBO-ENCODED DATA WITH CYCLIC REDUNDANCY CHECK

(71) Applicant: The United States of America as represented by the Secretary of the Navy, Washington, DC (US)

(72) Inventors: Gregory K. Fleizach, Newport, RI (US); Gary Lau, Poway, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 107 days.

(21) Appl. No.: 14/073,950

(22) Filed: Nov. 7, 2013

(51) Int. Cl.
*H03M 13/09* (2006.01)
*H03M 13/29* (2006.01)
*H04L 1/00* (2006.01)

(52) U.S. Cl.
CPC .............. *H03M 13/29* (2013.01); *H03M 13/09* (2013.01); *H04L 1/005* (2013.01); *H04L 1/0045* (2013.01); *H04L 1/0061* (2013.01)

(58) Field of Classification Search
CPC ..... H04L 1/005; H04L 1/0066; H04L 1/1819; H04L 1/1845; H04L 1/0061; H04L 1/0045; H03M 13/2957; H03M 13/09
USPC ................................................. 714/748, 758
See application file for complete search history.

(56) References Cited

U.S. PATENT DOCUMENTS

| | | | |
|---|---|---|---|
| 6,792,041 B1 * | 9/2004 | Kim et al. | 375/225 |
| 7,000,174 B2 * | 2/2006 | Mantha et al. | 714/790 |
| 7,234,095 B2 | 6/2007 | Lee et al. | |
| 7,499,417 B2 * | 3/2009 | Kim et al. | 370/310 |
| 7,508,805 B2 * | 3/2009 | Choi et al. | 370/342 |
| 8,214,727 B2 | 7/2012 | Kang et al. | |
| 8,408,475 B2 * | 4/2013 | Shen et al. | 235/492 |
| 2002/0168033 A1 | 11/2002 | Suzuki et al. | |
| 2005/0108610 A1 * | 5/2005 | Kim et al. | 714/748 |
| 2009/0077457 A1 | 3/2009 | Ramesh et al. | |
| 2011/0179330 A1 * | 7/2011 | Matsumoto | 714/748 |

OTHER PUBLICATIONS

Matache, A. et al., "Stopping Rules for Turbo Decoders", TMO Progress Report 42-142 Aug. 15, 2000, pp. 1-22.
Zhai, F. et al., "Techniques for Early Stopping and Error Detection in Turbo Decoding", IEEE Trans. on Comms., Oct. 2003, vol. 51, No. 10, pp. 1617-1623.

* cited by examiner

*Primary Examiner* — James C Kerveros
(74) *Attorney, Agent, or Firm* — Spawar Systems Center Pacific; Kyle Eppele; Ryan J. Friedl

(57) ABSTRACT

A method involves receiving at least one analog signal from a transmitter, converting the analog signal to digital waveform data representing the analog signal and storing the digital waveform data in a first memory storage area. The digital waveform data includes cyclic redundancy check (CRC) error-checking code and informational message data, and is modulated by an unknown frequency rate parameter. A chirp adjustment function is performed that includes multiplying the digital waveform data by a non-linear data array to correct for the unknown frequency rate parameter. An error-checking function is performed using the CRC error-checking code. If an error is found, the method involves iteratively performing the chirp adjustment function and the error-checking function. The method may be implemented in a receiver in a mobile communications system to correct for acceleration effects of the receiver.

20 Claims, 5 Drawing Sheets

SYSTEM AND METHOD FOR ACCELERATION EFFECT CORRECTION USING TURBO-ENCODED DATA WITH CYCLIC REDUNDANCY CHECK

FEDERALLY SPONSORED RESEARCH AND DEVELOPMENT

The System and Method for Acceleration Effect Correction Using Turbo-Encoded Data with Cyclic Redundancy Check is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 102019.

BACKGROUND

Error checking and correction are concepts critical to development of communications and advanced telemetry systems. Error detection algorithms enable reconstruction of original data without the need for retransmission. Many forward error correction (FEC) coders generate bit-error rate signals which can be used as feedback to fine-tune the analog receiving electronics.

Mobile communications and telemetry systems which operate in maritime, space and land environments have widely varying rates of expected acceleration which must be accommodated. Turbo codes and low-density parity-check (LDPC) are examples of error codes specially designed for 3G mobile communications, deep space vehicles, submarines and satellite communications, as well as Software Defined Radio (SDR) systems.

FEC decoders and other advanced error checking protocols known in the art do not account for errors caused by acceleration effects, as residual uncorrected errors remain after FEC decoding. It is desirable to increase the reliability of transmission channels by improving acceleration error detection and handling capability.

DETAILED DESCRIPTION OF SOME EMBODIMENTS

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Figure 1:
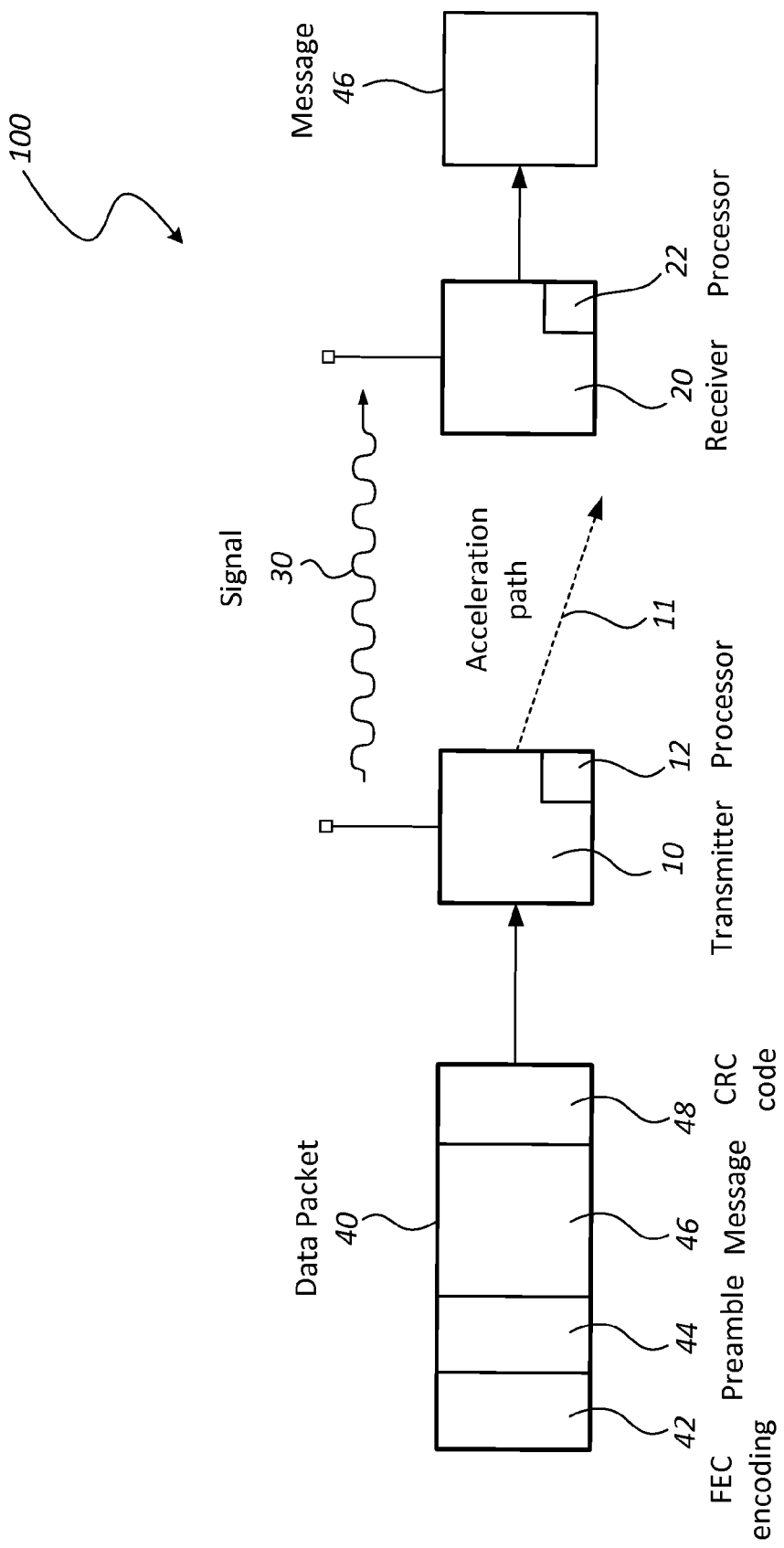
FIG. 1 shows an embodiment of a mobile communications system that may be used to implement a method in accordance with the System and Method for Acceleration Effect Correction Using Turbo-Encoded Data with Cyclic Redundancy Check.

FIG. 1 illustrates an embodiment of a mobile communications system 100 which implements a method in accordance with the System and Method for Acceleration Effect Correction Using Turbo-Encoded Data with Cyclic Redundancy Check. Mobile communications system 100 includes transmitter 10, receiver 20, analog signal 30, and data packet 40. Both transmitter 10 and receiver 20 are potentially mobile and subject to acceleration effects during transmission. As an example, analog signal 30 may be a direct sequence spread spectrum (DSSS) signal.

As shown, transmitter 10 has acceleration path 11. Transmitter 10 includes transmission processor 12. Mobile receiver 20 includes receiver processor 22. Transmission processor 12 may be a computer processor, a Field Programmable Gate Array (FPGA) or any other circuitry or software known in the art for transmitting and receiving analog and digital signals and for encoding data packets. Receiver processor 22 may be a computer processor, an FPGA or any other circuitry or software known in the art capable of receiving analog signal, digitizing analog signals and performing encoding and decoding and other logical operations.

Transmission processor 12 is a processor configured to create data packet 40 which is a data packet created using any protocol known in the art. Data packet 40 is a data packet which contains digital data representing analog signal 30. In the embodiment shown, data packet 40 includes forward error correction (FEC) encoding 42, a preamble 44, informational message 46 and CRC error checking code 48.

Preamble 44 is a data sequence for identification and synchronization, known in the art. Preamble 44 is used for synchronization of timing, frequency and phase, and may be used by receiver processor 22 to determine a start time.

Transmission processor 12 must be able to form data packet 40 including both error-checking and error-detection code. In the embodiment shown, error-checking code 48 is cyclic redundancy check, but may be any error-checking code known in the art. In the embodiment shown, the appended CRC error-checking code 48 is a generator polynomial of sufficient length (e.g. 32 bits) to meet the receiver bit error rate (BER) specifications of the receiver to enable receiver 20 to determine when correct decoding has occurred. CRC error-checking code 48 is appended to data packet 40 prior to Turbo encoding which is performed by transmission processor 12. Receiver 20 must be able to decide with confidence when a correct decoding has occurred.

In the embodiment of system 100 shown in FIG. 1, transmitter 10 is accelerating along acceleration path 11. Receiver 20 is not in motion and therefore is not accelerating along an acceleration path. In other embodiments, receiver 20, may be mobile and have an acceleration path. In the embodiment shown, analog signal 30 is an electromagnetic waveform having an amplitude, wavelength and phase shift. In one embodiment, analog signal 30 is a radio wave.

The receiver processor 22 is configured to receive analog signal 30 from transmitter 10 and convert analog signal 30 into digital waveform data, The digital wave form data is then stored in a memory storage area with receiver processor 22. The digital wave form data includes CRC error-checking code 48, informational message data 46 and is modulated by an unknown frequency rate parameter.

Upon receipt of analog signal 30, signal acquisition may be performed to align the signal in both time and frequency with a reference signal. If the preamble length is short enough, then the maximum expected acceleration will have a negligible effect on acquisition. Once the start time and frequency offset of the received analog signal are estimated and used to align the data, the result is the transmitted signal with an unknown phase offset and an unknown frequency rate offset.

The frequency rate offset is corrected by multiplying the time- and frequency-aligned data with a chirp. Accordingly, receiver processor 22 then performs a chirp adjustment function by multiplying the digital waveform data by a non-linear data array and iteratively performing error checking using CRC error-checking code 48 to correct for the frequency rate parameter. Receiver processor 22 then performs an error-checking function using the CRC error-checking code 48.

If an error is found the chirp adjustment error-checking function is iteratively repeated until one of the three terminating cases exists. The first terminating case is that if no error is found, and thus receiver processor 22 determines that no further acceleration adjustments are necessary. The second terminating case is that a predetermined number of iterations are exceeded. The third terminating case is that expected range accelerations are exceeded. If the number of iterations or expected range of acceleration is exceeded, the receiver processor 22 generates a message indicating that an uncorrected transmission error has occurred.

FIG. 1 also illustrates that data packet 40 is decoded by receiver processor 22 and informational message 46 and is ultimately generated as a reliable output signal containing informational message 46. In various embodiments, receiver processor 22 may process multiple signals (loops) in parallel to decrease processing time. In still other embodiments, analog signal 30 may be a frequency hopping spread signal.

Figure 2:
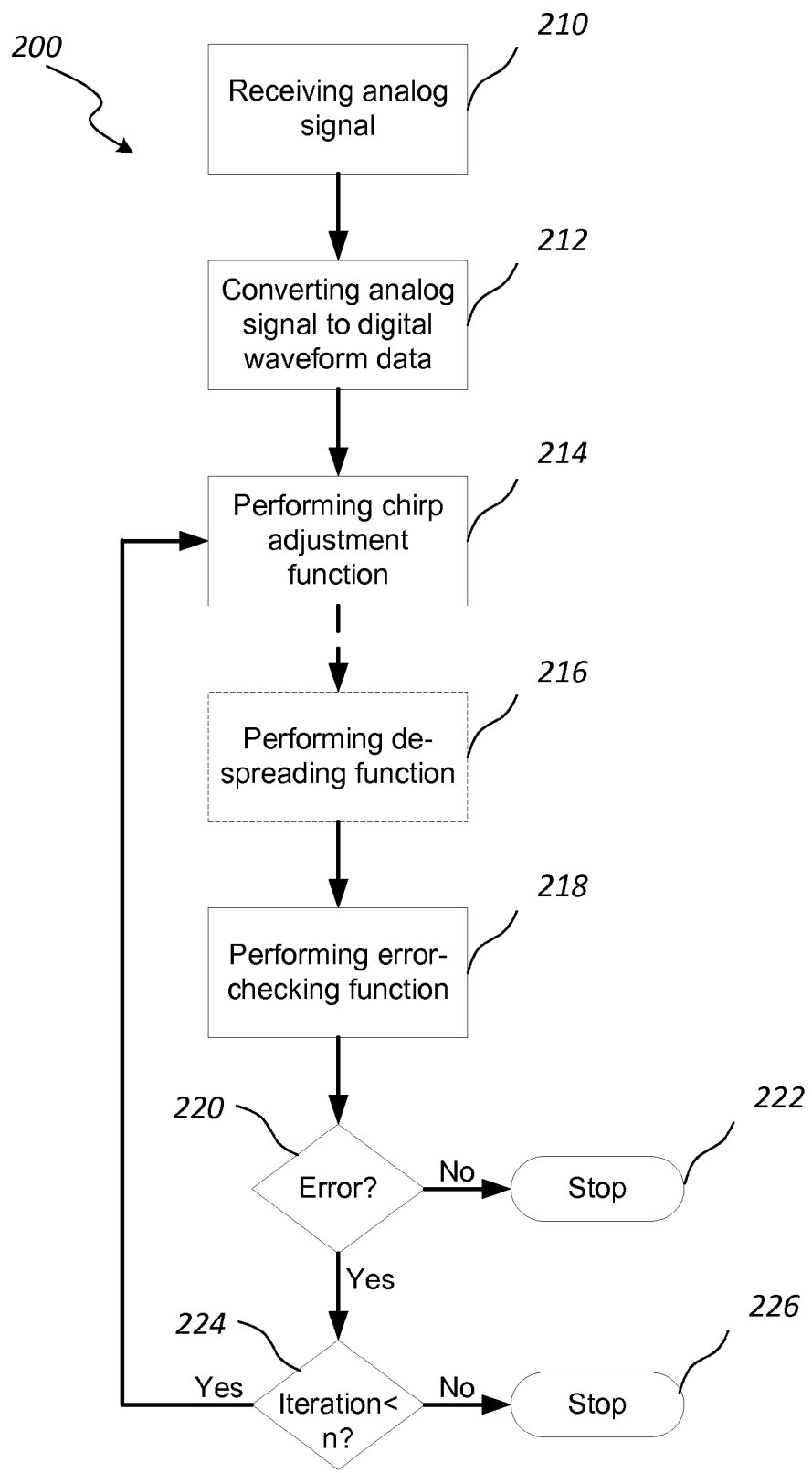
FIG. 2 shows an embodiment of a method in accordance with the System and Method for Acceleration Effect Correction Using Turbo-Encoded Data with Cyclic Redundancy Check.
Figure 4:
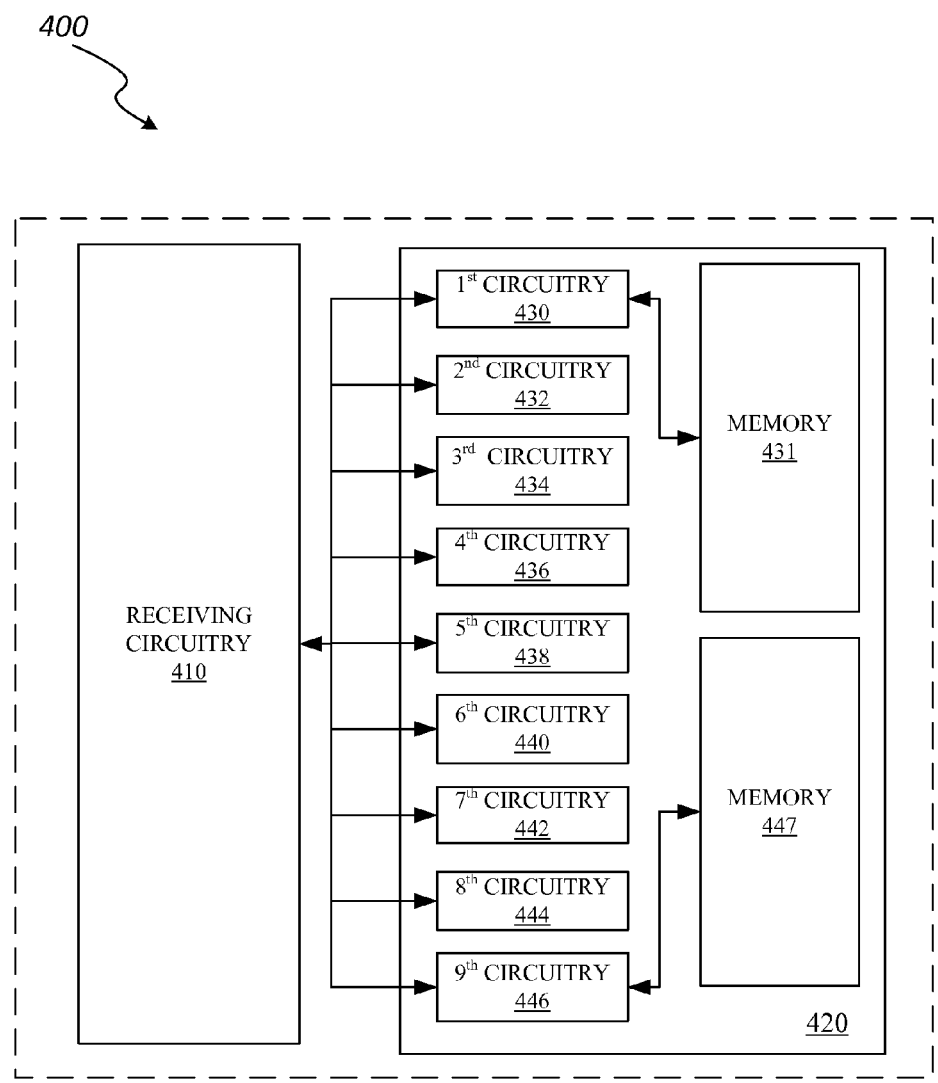
FIG. 4 shows a diagram illustrating circuitry for a receiver system in accordance with the System and Method for Acceleration Effect Correction Using Turbo-Encoded Data with Cyclic Redundancy Check.

FIG. 2 illustrates method 200 in accordance with the System and Method for Acceleration Effect Correction Using Turbo-Encoded Data with Cyclic Redundancy Check. For illustrative purposes, method 200 will be discussed with reference to FIG. 1. In Step 210, method 200 is initiated when receiver processor 22 receives an analog signal 30 from a mobile transmitter. As an example, receiver processor 22 may include circuitry such as processing circuitry 420 shown in FIG. 4, with such circuitry specifically configured in connection with the appropriate software to perform the steps of method 200. In Step 212, receiver processor 22 converts analog signal 30 to a digital waveform signal, and in Steps 214 and 216, receiver processor 22 iteratively performs chirp adjustment and error checking functions until the signal transmission is either deemed to be correct, or until predetermined thresholds for acceleration exceeded.

In Step 210, receiver processor 22 receives analog signal 30 from mobile transmitter 10. The transmission also includes noise. Analog signal 30 is a received as modulated data packet. In various embodiments, coded bits may be modulated to coded symbols depending on the modulation scheme. In Step 212, analog signal 30 is represented by a digital waveform data containing a preamble, a CRC error-checking code, informational message data and is modulated by an unknown frequency rate parameter.

In Step 214, the chirp adjustment function comprises multiplying the digital waveform data by a non-linear data array to determine the unknown frequency rate data value. The non-linear data value is determined by the formula $$e^{-2\pi j\left(\frac{A_n}{2}\right)(t^2)},$$

where j is the imaginary number, $A_n$ is a frequency rate proportional to the relative mobile transmitter acceleration value, and t is a time vector spanning the length of the waveform data. Values for $A_n$ are determined based on a maximum relative mobile transmitter acceleration value $A_{max}$ and the maximum number of iterations n.

In Step 216, receiver processor 22 performs a de-spreading calculation if analog signal 30 is spread across a wider bandwidth, such as in frequency hopping transmissions. For example, if analog signal 30 is a DSSS signal, de-spreading converts the spread signal, which is modulated at the chip rate, to the coded bits, which are modulated at the coded bit rate. In one embodiment, the de-spreading calculation is performed by multiplying the frequency rate-corrected signal chi-by-chip with the spreading code to remove the modulation. For BPSK modulated signals, modulo-2 addition is performed on the digital waveform data by a known spreading code value, resulting in a de-spread digital signal. In some embodiments of method 200, Step 216 is optional. The de-spread coded bits may then be input to a phase-locked loop (PLL) to remove any residual phase offsets.

In some embodiments, the next step involves performing Turbo decoding. Since the initial phase of the coded bits is unknown, both the output from the PLL (if used) and its inverse are turbo decoded. Even if some number of coded bits was set to a known pattern to try to avoid this double decoding, the receiver could not be sure if only those bits were in error or all the coded bits had been flipped. Thus, the turbo decoding operates on two different sets of coded bits. The CRC of each set of decoded bits may then be calculated.

In Step 218, receiver processor 22 performs an error-checking function using the CRC error-checking code. At Step 220, method 200 determines if an error is found. If not, method 200 stops at Step 222. If the function finds an error, then step 224 involves a determination as to whether the method has iterated back to step 214 less than n times. If so, method 200 loops back to Step 214 and repeats using a different frequency rate proportional to the relative mobile transmitter acceleration value $A_n$.

If the error-checking function indicates that no errors have occurred for the digital signal, then a correct decoding is declared and method 200 stops at Step 222. The receiver 20 can declare a correct decoding with high confidence since the CRC error-checking code polynomial was initially chosen to have sufficient length to protect against false CRC error-checking codes indicating a correct check. The probability of a false check is proportional to the length of the CRC error-checking code.

If neither set of decoded bits passes the CRC, then the whole process may be iterated starting with a new frequency rate correction of the spread coded bits. The process is iterated with a new frequency rate correction until all possible frequency rate correction steps, covering the range dictated by the maximum expected acceleration, are attempted. If at Step 224 the number of iterations performed exceeds the maximum number of iterations n, method 200 stops at Step 226 and receiver processor 22 generates an output message 46 that no signal was present. This prevents receiver processor 22 from reporting an informational message 46 with potential errors. A no-signal output message is possible when the receiver noise induces more errors than the FEC decoding can correct, even with the correct chirp adjustment function. The scenario of no signal being found (or no signal being present) gives the worst case for processing time.

The size of the frequency rate steps to choose depends on the PLL that will correct residual phase offsets after de-spreading. As an example, the frequency estimate from preamble acquisition may be good to within 1 Hz, so the bandwidth of the PLL may be made quite small to minimize the noise. The second-order PLL used is also technically not capable of correcting for frequency rate. However, it was determined experimentally that small frequency rate offsets (about 2 Hz/s) can be accommodated. Higher frequency rate offsets, however, tend to produce less than desirable results. Accordingly, frequency rate steps twice the size of the smallest acceptable frequency rate offsets up to 2 Hz/s, then the frequency rate steps that are looped over can be as large as 4 Hz/s. This is because the largest offset between the actual frequency rate and the frequency rate steps can be at most 2 Hz/s. For example, consider the frequency rate steps 0 Hz/s and 4 Hz/s where the largest offset possible is 2 Hz/s and then the frequency rate starts to get closer to one step or the other.

While method 200 is performed serially, in an alternate embodiment the method 200 can be processed in parallel. This would decrease overall processing time at the expense of computing power. Further, for simplicity, the method 200 could run for a fixed number of iterations before performing an error-checking function.

Figure 3A:
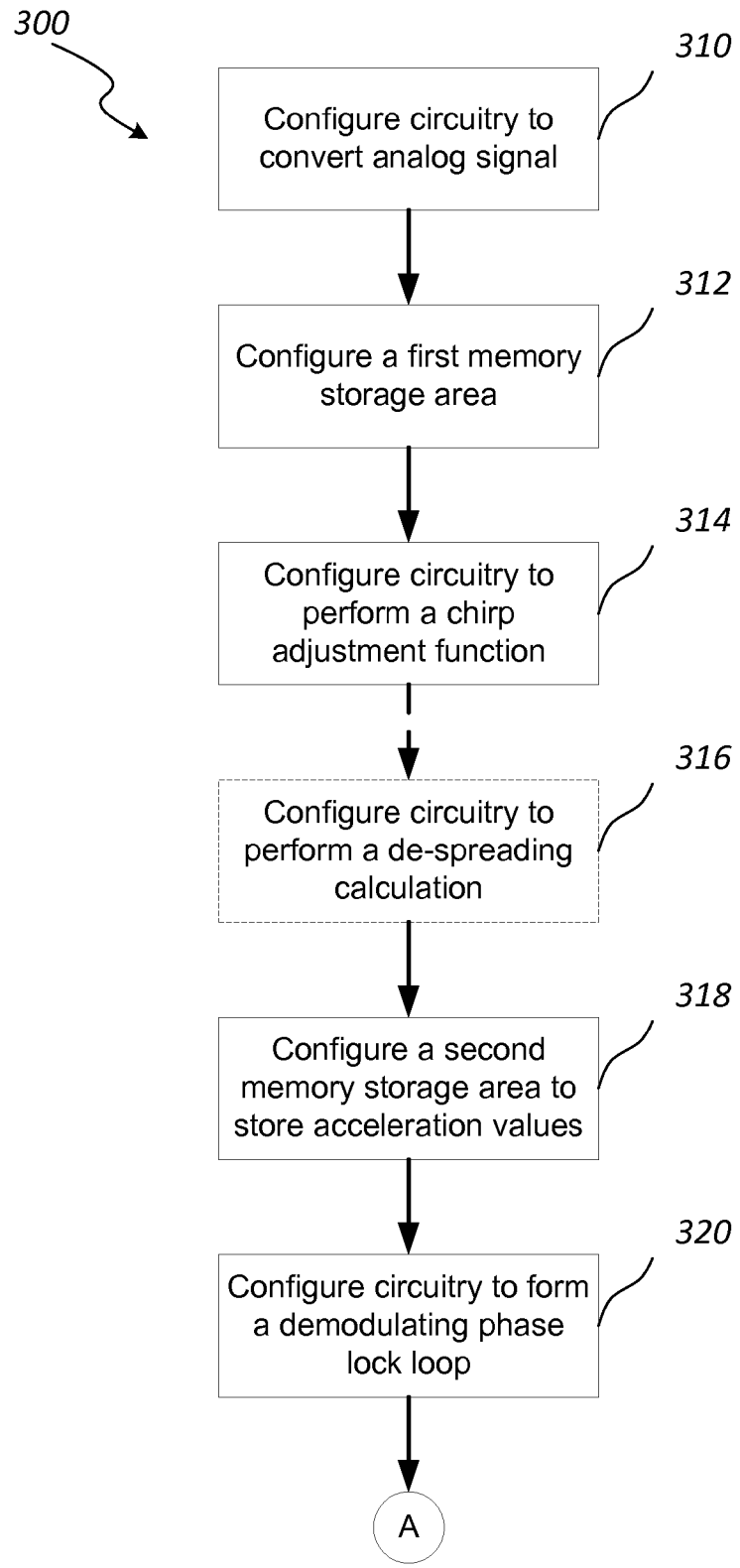
FIGS. 3A and 3B illustrate an embodiment of a method for making a processing component in accordance with the System and Method for Acceleration Effect Correction Using Turbo-Encoded Data with Cyclic Redundancy Check.
Figure 3B:
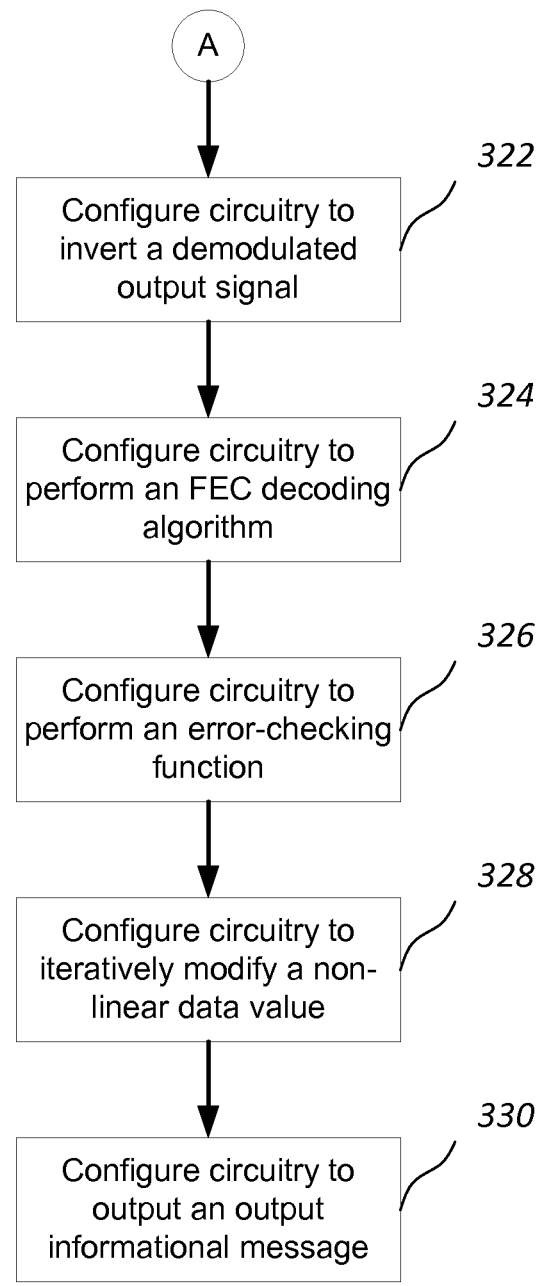

FIGS. 3A and 3B illustrate an embodiment of a method 300 of programming a processing component in accordance with the System and Method for Acceleration Effect Correction Using Turbo-Encoded Data with Cyclic Redundancy Check. For illustrative purposes, method 300 will be discussed with reference to FIG. 4, which shows a diagram illustrating circuitry 400 for a receiver system in accordance with the System and Method for Acceleration Effect Correction Using Turbo-Encoded Data with Cyclic Redundancy Check.

Circuitry 400 may include receiver circuitry 410, which may be included within receiver 20 shown in FIG. 1, as well as processing circuitry 420, which may be included within receiver processor 22 shown in FIG. 1. Processing circuitry 420 is specifically configured in connection with the appropriate software to perform the steps of method 300. It should be understood that while one embodiment of processing circuitry 420 is configured as discussed herein, processing circuitry 420 may be configured to include more or less circuitry while achieving the same steps and/or functionality as discussed with respect to method 300.

In Step 310 an analog signal, such as signal 30, is received and digitized by first circuitry 430. At step 312, first memory storage 431 is configured by first circuitry 430 and the digitized waveform data is stored therein. In Step 314 second circuitry 432 is configured to perform a chirp adjustment function. Step 316 configures third circuitry 434 to perform a de-spreading calculation. Step 318 configures a second memory storage area 447, which may be performed by ninth circuitry 446. Step 320 configures fourth circuitry 436 to form a demodulating phase lock loop. Step 322 configures fifth circuitry 438 to invert a first demodulated output signal. Step 324 configures sixth circuitry 440 to perform an FEC decoding algorithm. Step 326 configures seventh circuitry 442 to perform a first and a second error-checking function. Step 328 configures eighth circuitry 444 to iteratively modify the non-linear data array. Step 330 configures ninth circuitry 446 to output an informational message 46.

In Step 310 the method is initiated when analog signal 30 is received from transmitter 10. Analog signal 30 is digitized by first circuitry 430 represented by digital waveform data, such as in data packet 40, which includes CRC error-checking code 48, informational message data 46, and is modulated by an unknown frequency rate parameter. The unknown frequency parameter occurs due to the acceleration effects on transmitter 10. CRC error-checking code 48 is a generator polynomial of sufficient length that it meets the receiver bit error rate requirements. The exemplary embodiment uses a 32-bit CRC error-checking code. In Step 312 a memory storage area 431 is configured to store the digital waveform data.

In Step 314 second circuitry 432 is configured to perform a chirp adjustment function comprised of multiplying the digital waveform data by a non-linear data array to determine the unknown frequency rate data value. The non-linear data value is determined by the formula $$e^{-2\pi j\left(\frac{A_n}{2}\right)(t^2)},$$

where j is the imaginary number, $A_n$ is a frequency rate proportional to the relative mobile transmitter acceleration value, and t is a time vector spanning the length of the waveform data.

Step 316 configures third circuitry 434 to perform a de-spreading calculation on the chirp adjusted digital waveform data if the analog signal is spread across a wider bandwidth, such as in frequency hopping transmissions. As an example, the de-spreading calculation performed for a DSSS signal is modulo-2 addition on the digital signal by a known spreading code value, resulting in a de-spread digital signal. In some embodiments, step 316 may be optional.

In Step 318, a second memory storage area 447 is configured by ninth circuitry 446 to store a plurality of the non-linear data arrays corresponding to a known range of relative mobile transmitter acceleration values between $A_{min}$, a minimum relative mobile transmitter acceleration value, and $A_{max}$, a maximum relative mobile transmitter acceleration value. In alternate embodiments, this step may also include storing a plurality of frequency rates proportional to relative mobile transmitter acceleration value A. Each of the plurality of frequency rates proportional to relative mobile transmitter acceleration value $A_n$ varies from any other of the plurality of frequency rates proportional to relative mobile transmitter acceleration value $A_n$ by a set step value. The $A_{min}$, $A_{max}$, and $A_n$ values may be hard-coded into the second memory storage area or the second memory storage area may be over-writable to permit the processing component to store different values of $A_{min}$, $A_{max}$, and $A_n$.

In Step 320 fourth circuitry 436 is configured circuitry to form a demodulating phase lock loop to generate a first demodulated output signal having an output phase related to an input phase of the waveform data. This will enable the processing component to demodulate phase-shift keying modulations, such as, but not limited to, binary phase-shift keying or quadrature phase-shift keying. In one embodiment, the demodulating phase lock loop is a second-order phase lock loop. In one embodiment, the demodulating phase lock loop is a third-order phase lock loop. A small demodulating phase lock loop bandwidth minimizes noise, while higher bandwidths may make FEC decoding impossible.

Step 322 involves configuring fifth circuitry 438 to invert the first demodulated output signal to create a second demodulated output signal. This permits the processing component to account for the unknown phase data value.

Step 324 configures sixth circuitry 440 to perform an FEC decoding algorithm on the first demodulated output signal and the second demodulated output signal. In this exemplary embodiment, the circuitry is configured to perform turbo decoding. Alternate embodiments may instead perform, but are not limited to, convolutional decoding, concatenated decoding, Reed-Solomon decoding and other types of block decoding and convolutional decoding. Since the initial phase of the digital signal is unknown, both the first demodulated output signal from the demodulating phase lock loop and its inverse, the second demodulated output signal, are FEC decoded. Even if some portion of the first demodulated output signal was set to a known pattern to try to avoid this double decoding, the receiver could not be sure if only that portion was in error or all first demodulated output signal had been flipped. The FEC decoding operates on a first and second demodulated output signal. Sixth circuitry 440 may be configured to process the first demodulated output signal and the second demodulated output signal serially or in parallel.

Step 326 configures seventh circuitry 442 to perform a first error-checking function for the first demodulated output signal and a second error-checking function for the second demodulated output signal. In one embodiment, the error-checking function is a cryptographic hash function, such as a Secure Hash Algorithm. Step 326 also configures seventh circuitry 442 to compare the results of the first error-checking function and the results of the second error-checking function to the CRC error-checking code and generate a decision value of incorrect or correct.

Step 328 configures eighth circuitry 444 to iteratively modify the non-linear data array and apply the non-linear data array to the waveform data if the decision value is incorrect until the decision value is correct. Step 330 configures ninth circuitry 446 to output as an output informational message 46 either the first demodulated output signal and the second demodulated output signal. Ninth circuitry 446 is configured to output the demodulated output signal which results in a correct decision value.

Some or all of the steps of methods 200 and 300 may be stored on a non-transitory computer readable storage medium, wherein the steps are represented by computer readable programming code. The steps of methods 200 and 300 may also be computer-implemented using a programmable device, such as a computer-based system. Methods 200 and 300 may comprise instructions that, when loaded into a computer-based system, cause the system to execute the steps of methods 200 and 300. Methods 200 and 300 may be implemented using various programming languages, such as "Java", "C", or "C++".

Various storage media, such as magnetic computer disks, optical disks, and electronic memories, as well as computer readable media and computer program products, can be prepared that can contain information that can direct a device, such as a micro-controller, to implement the above-described systems and/or methods. Once an appropriate device has access to the information and programs contained on the storage media, the storage media can provide the information and programs to the device, enabling the device to perform the above-described systems and/or methods.

For example, if a computer disk containing appropriate materials, such as a source file, an object file, or an executable file, were provided to a computer, the computer could receive the information, appropriately configure itself, and perform the functions of the various systems and methods outlined in the diagrams and flowcharts above to implement the various functions. That is, the computer could receive various portions of information from the disk relating to different elements of the above-described systems and/or methods, implement the individual systems and/or methods, and coordinate the functions of the individual systems and/or methods.

The language used in the specification has been principally selected for readability and instructional purposes, and may not have been selected to delineate or circumscribe the inventive subject matter. Accordingly, the disclosure of the inventive subject matter is intended to be illustrative, but not limiting, of the scope of the invention, which is set forth in the following claims.

The system and method disclosed herein provide for robust acceleration correction without using an accelerometer and provide very low BERs if the CRC generator polynomial has a high enough degree. A high degree of confidence in the accuracy of the received message is obtained instead of not knowing how many residual errors might exist after Turbo decoding. Further, the system and method identify when a message cannot be correctly decoded instead of reporting a message with an unknown number of errors.

Many modifications and variations of the System and Method for Acceleration Effect Correction Using Turbo-Encoded Data with Cyclic Redundancy Check are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

We claim:
1. A method comprising the steps of:
receiving at least one analog signal from a transmitter;
converting the analog signal to digital waveform data representing the analog signal and storing the digital waveform data in a first memory storage area, wherein the digital waveform data includes cyclic redundancy check (CRC) error-checking code and informational message data and is modulated by an unknown frequency rate parameter;
performing a chirp adjustment function comprising multiplying the digital waveform data by a non-linear data array to correct for the unknown frequency rate parameter;
performing an error-checking function using the CRC error-checking code; and
if an error is found, iteratively repeating the steps of performing a chirp adjustment function and performing an error-checking function.

2. The method of claim 1, wherein the step of performing a chirp adjustment function further comprises calculating the non-linear data array using the formula $$e^{-2\pi j\left(\frac{A_n}{2}\right)(t^2)},$$

, where j is an imaginary number, $A_n$ is a frequency rate proportional to the relative mobile transmitter acceleration value, and t is a time vector spanning the length of the waveform data.

3. The method of claim 2, wherein the step of performing a chirp adjustment function further comprises determining $A_n$ based on a maximum relative mobile transmitter acceleration value $A_{max}$ and a maximum number of iterations n.

4. The method of claim 3, wherein if n is exceeded, the method further comprises the step of generating an output message that no signal was present.

5. The method of claim 1 further comprising the step of performing a de-spreading calculation comprising modulo-2 addition on the digital waveform data by a known spreading code value.

6. A method comprising the steps of:
configuring first circuitry to convert at least one analog signal received, at a receiver, from a mobile transmitter to digital waveform data representing the analog signal, wherein the digital waveform data includes CRC error-checking code and informational message data and is modulated by an unknown frequency rate parameter;

configuring a first memory storage area to store the digital waveform data;

configuring second circuitry to perform a chirp adjustment function comprising multiplying the digital waveform data by a non-linear data array to correct for the unknown frequency rate parameter caused by an acceleration effect on of one of the mobile transmitter and the receiver;

configuring third circuitry to perform a de-spreading calculation on the chirp adjusted digital waveform data to create a de-spread digital signal;

configuring fourth circuitry to form a demodulating phase lock loop to generate a first demodulated output signal having an output phase related to an input phase of the digital waveform data;

configuring fifth circuitry to invert the first demodulated output signal to create a second demodulated output signal to account for unknown phase data value;

configuring sixth circuitry to perform a forward error correction (FEC) decoding algorithm on the first demodulated output signal and the second demodulated output signal;

configuring seventh circuitry to perform a first error-checking function for the first demodulated output signal and a second error-checking function for the second demodulated output signal and compare the results of the first error-checking function and the results of the second error-checking function to the CRC error-checking code and generate a decision value of incorrect or correct;

configuring eighth circuitry to iteratively modify the non-linear data array and apply the non-linear data array to the waveform data if the decision value is incorrect until the decision value is correct; and configuring ninth circuitry to output as an output informational message either of the first demodulated output signal and the second demodulated output signal which results in the decision value as correct.

7. The method of claim 6, wherein the step of configuring circuitry to perform a chirp adjustment function further includes the step of configuring the second circuitry to calculate the non-linear data array using the formula $$e^{-2\pi j\left(\frac{A_n}{2}\right)(t^2)},$$

where j is an imaginary number, $A_n$ is a frequency rate proportional to the relative mobile transmitter acceleration value, and t is a time vector spanning the length of the waveform data.

8. The method of claim 7, wherein the ninth circuitry is further configured to form a second memory storage area to store a plurality of the non-linear data arrays corresponding to a known range of relative mobile transmitter acceleration values between a minimum relative mobile transmitter acceleration value $A_{min}$ and a maximum relative mobile transmitter acceleration value $A_{max}$.

9. The method of claim 8, further including the step of storing a plurality of frequency rates proportional to relative mobile transmitter acceleration value $A_n$, wherein each of the plurality of frequency rates proportional to relative mobile transmitter acceleration value $A_n$ varies from any other of the plurality of frequency rates proportional to relative mobile transmitter acceleration value $A_n$ by a set step value.

10. The method of claim 9, further including the step of configuring the second memory storage area to be over-writable during use of the processing component.

11. The method of claim 6, further including the step of configuring third circuitry to perform a de-spreading calculation comprising modulo-2 addition on the digital waveform signal by a known spreading code value.

12. The method of claim 6, wherein the FEC decoding algorithm is selected from a group consisting of turbo decoding, convolutional decoding, concatenated decoding, and Reed-Solomon decoding.

13. The method of claim 6, further including the step of configuring the first memory storage area to be over-writable during use of the processing component.

14. The method of claim 6, wherein the processing component is a field-programmable gate array.

15. A system comprising:
a receiver configured to receive at least one analog signal from a mobile transmitter; and
a processing component comprising
first circuitry configured to convert at least one analog signal received from the mobile transmitter to digital waveform data representing the analog signal, wherein the digital waveform data includes CRC error-checking code, informational message data and is modulated by an unknown frequency rate parameter caused by an acceleration effect on of one of the mobile transmitter and the receiver;
a first memory storage area configured to store the digital waveform data;
second circuitry configured to perform a chirp adjustment function comprised of multiplying the digital waveform data by a non-linear data array to correct for the unknown frequency rate parameter;
third circuitry configured to form a demodulating phase lock loop to generate a first demodulated output signal having an output phase related to an input phase of the waveform data;
fourth circuitry configured to invert the first demodulated output signal to create a second demodulated output signal to account for the unknown phase of the received waveform;
fifth circuitry configured to perform an FEC decoding algorithm on the first demodulated output signal and the second demodulated output signal;
sixth circuitry configured to perform a first error-checking function for the first demodulated output signal and a second error-checking function for the second demodulated output signal and compare the results of the first error-checking function and the results of the second error-checking function to the CRC error-checking code and generate a decision value of incorrect or correct;
seventh circuitry configured to iteratively modify the non-linear data array and apply the non-linear data array to the waveform data if the decision value is incorrect until the decision value is correct; and
eighth circuitry configured to output at least one of the first demodulated output signal and the second demodulated output signal if the if the decision value is correct.

16. The system of claim 15, wherein the second circuitry is further configured to calculate the non-linear data array using the formula $$e^{-2\pi j\left(\frac{A_n}{2}\right)(t^2)},$$

where j is an imaginary number, $A_n$ is a frequency rate proportional to the relative mobile transmitter acceleration value, and t is a time vector spanning the length of the waveform data.

17. The system of claim 16, wherein the processing component further includes ninth circuitry configured to form a second memory storage area to store a plurality of the nonlinear data arrays corresponding to a known range of relative mobile transmitter acceleration values between a minimum relative mobile transmitter acceleration value $A_{min}$ and a maximum relative mobile transmitter acceleration value $A_{max}$.

18. The system of claim 17, wherein the known range of relative mobile transmitter acceleration values is at least one known range of relative mobile transmitter acceleration values corresponding to at least one type of active transport vehicle.

19. The system of claim 18, wherein the known range of relative mobile transmitter acceleration values are hard-coded into the processing component.

20. The system of claim 18, wherein at least one known range of relative mobile transmitter acceleration values corresponding to at least one type of active transport vehicle is a plurality of known ranges of relative mobile transmitter acceleration values corresponding to a plurality of types of active transport vehicle.

* * * * *